United States Patent
Prakash et al.

(10) Patent No.: US 11,777,517 B2
(45) Date of Patent: Oct. 3, 2023

(54) GAIN ERROR REDUCTION IN SWITCHED-CAPACITOR DELTA-SIGMA DATA CONVERTERS SHARING A VOLTAGE REFERENCE WITH A DISABLED DATA CONVERTER

(71) Applicant: CIRRUS LOGIC INTERNATIONAL SEMICONDUCTOR, LTD., Edinburgh (GB)

(72) Inventors: Chandra Prakash, Austin, TX (US); Bhupendra Manola, Austin, TX (US); John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 507 days.

(21) Appl. No.: 17/096,582

(22) Filed: Nov. 12, 2020

(65) Prior Publication Data
US 2022/0149864 A1    May 12, 2022

(51) Int. Cl.
*H03M 3/00* (2006.01)

(52) U.S. Cl.
CPC .......... *H03M 3/354* (2013.01); *H03M 3/422* (2013.01)

(58) Field of Classification Search
CPC ..................................................... H03M 3/354
USPC .......................................................... 327/540
See application file for complete search history.

(56) References Cited

U.S. PATENT DOCUMENTS 6,147,522 A * 11/2000 Rhode .................... H03M 3/368
327/93

* cited by examiner

*Primary Examiner* — Tomi Skibinski
(74) *Attorney, Agent, or Firm* — Mitch Harris, Atty at Law, LLC; Andrew M. Harris (57) ABSTRACT

An integrated circuit having multiple switched-capacitor delta-sigma data converter circuits includes compensation for voltage reference error due to leakage current that causes reference voltage droop. The reference filter capacitor terminal voltage is maintained by periodic connection to the reference feedback capacitor(s) that are alternately connected to a voltage reference buffer, and the leakage into the reference feedback capacitor networks of disabled converter circuits causes reference voltage droop. The compensation is either determined from the number of converter circuits that are disabled, or from an error between the filter capacitor voltage and a separate voltage reference, and may be applied by adjusting a resistance selectively coupled between the voltage reference buffer output and the filter capacitor, feedback applied to the voltage reference buffer or its input source. Alternatively, or in combination, correction may be applied to the output of the active converters by digital adjustment of output values.

34 Claims, 10 Drawing Sheets

GAIN ERROR REDUCTION IN SWITCHED-CAPACITOR DELTA-SIGMA DATA CONVERTERS SHARING A VOLTAGE REFERENCE WITH A DISABLED DATA CONVERTER

BACKGROUND

1. Field of Disclosure

The field of representative embodiments of this disclosure relates to methods and circuits that reduce or remove gain error due to leakage from reference capacitors in switched-capacitor delta-sigma data converter circuits sharing a voltage reference with a disabled data converter.

2. Background

Voltage references directly affect the accuracy of data converters such as analog-to-digital converters (ADCs), digital-to-analog converters (DACs), and other circuits in which comparison of a voltage level to a precision reference is performed. In most switched-capacitor delta-sigma data converters, the application of the reference voltage is made by a reference switched-capacitor network that applies samples of the voltage reference as feedback charge quanta that cancel an input voltage provided to the integrator of the delta-sigma data converter.

Particularly in switched-capacitor delta-sigma data converters such as those disclosed in U.S. Pat. No. 6,147,522, which have a two-phase reference application in coarse and fine phases, the ultimate reference voltage applied in a conversion is determined by the voltage across the fine-phase reference filter capacitor, which is never connected directly to the output of the voltage reference, but is charged to the reference voltage by the periodic switching of the reference capacitors between the voltage reference output and the reference filter capacitor.

Integrated circuits (ICs) such as coder-decoder ICs (CODECs) and system-on-chip ICs (SOCs) typically include multiple data converters, e.g., a simple stereo CODEC may have two analog-to-digital converters (ADCs) and two digital-to-analog converters (DACs) that all share the same voltage reference circuit in order to conserve die area and power. However, when one or more of the data converters is in a power-down mode, and even though the switching network that couples the reference filter capacitor to the reference capacitors is disabled, the leakage through the transistors that make up the switching circuit is sufficient to cause significant voltage droop across the reference filter capacitor, in turn leading to gain error in other converters that are operating.

Therefore, it would be advantageous to reduce or eliminate the gain error caused in such switched-capacitor delta-sigma data converters when other converters sharing the same voltage reference are disabled.

SUMMARY

Improved delta-sigma data converter operation is accomplished in integrated circuits including multiple switched-capacitor delta-sigma data converters and their methods of operation.

The switched-capacitor delta-sigma data converter circuits include a voltage reference circuit that provides a voltage reference output, an integrator with an input for receiving an input voltage, a quantizer for generating a digital value quantizing an output of the integrator, a reference feedback switched-capacitor network alternatively coupled between the voltage reference output and the integrator for providing feedback charge quanta representing an output of the quantizer so that the output of the quantizer, on average, represents the input voltage. The reference feedback switched-capacitor networks maintain the filter capacitor voltage used to provide the reference in fine charging phases of the converters by periodic connection to the reference feedback switched-capacitor networks of the converters. A voltage droop compensation circuit compensates for current leakage through switches of the reference feedback switched-capacitor networks in disabled converters that causes gain error due to reference voltage droop.

In some embodiments, the voltage droop compensation circuit receives information from a power management circuit that selects an active or inactive state for the multiple data converters. The compensation amount applied by the voltage droop compensation circuit may be a selectable resistance of a resistor coupled between the filter capacitor and the voltage reference buffer, a selection of an "on state" of switches of the reference feedback capacitor network to couple the voltage reference buffer to the reference feedback capacitor to maintain the voltage on the reference feedback switched-capacitor networks directly in the disabled converters, or feedback may be determined and applied to the voltage reference buffer or its input voltage reference source based on the quantity of the converters that are in the inactive state.

In other alternative embodiments, the error between the voltage reference buffer output and the voltage across the filter capacitor may be measured and used to provide feedback to the voltage reference buffer or its input voltage reference source, or to generate a correction factor that is digitally applied to the outputs of the active converters.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DESCRIPTION OF ILLUSTRATIVE EMBODIMENT

The present disclosure encompasses integrated circuits that include multiple switched-capacitor delta-sigma data converters and include compensation for voltage reference gain error caused by leakage in the reference feedback switched-capacitor networks of disabled converters that causes voltage droop in the fine phase reference voltage. The fine phase reference voltage is provided from a filter capacitor and is only maintained by periodic switching of the reference feedback switched-capacitor between a voltage reference buffer output and the filter capacitor. A voltage droop compensation circuit compensates for the leakage. In some embodiments, the voltage droop compensation circuit receives information from power management circuit that selects an active or inactive state for the multiple data converters. The compensation amount applied by the voltage droop compensation circuit may be a selectable resistance of a resistor coupled between the filter capacitor and the voltage reference buffer, a selection of an "on state" of switches of the reference feedback capacitor network to couple the voltage reference buffer to the reference feedback capacitor to maintain the voltage on the reference feedback switched-capacitor networks directly in the disabled converters, or feedback may be determined and applied to the voltage reference buffer or its input voltage reference source based on the quantity of the converters that are in the inactive state. In other alternative embodiments, the error between the voltage reference buffer output and the voltage across the filter capacitor may be measured and used to provide feedback to the voltage reference buffer or its input voltage reference source, or to generate a correction factor that is digitally applied to the outputs of the active converters.

Figure 1:
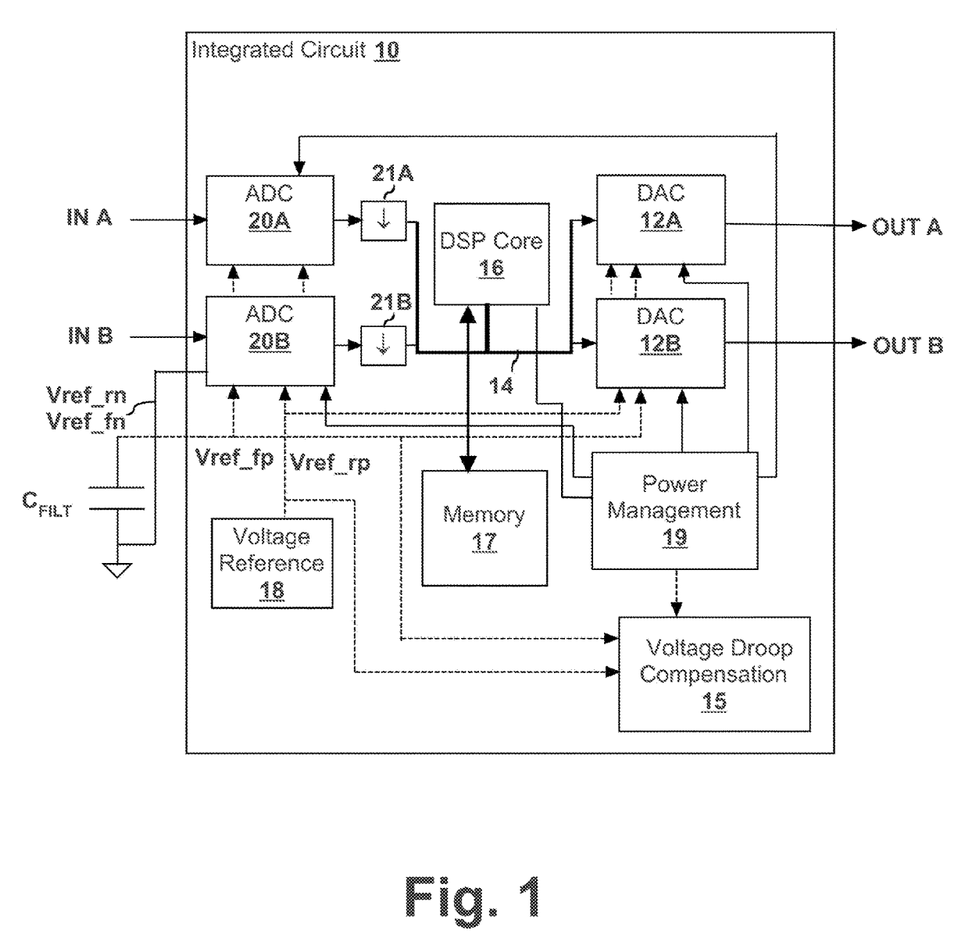
FIG. 1 is a block diagram of an example integrated circuit 10 according to an embodiment of the disclosure.

Referring now to FIG. 1, an example of an integrated circuit (IC) 10 that may be, for example, a CODEC or SoC integrated circuit, in accordance with an embodiment of the disclosure. Two input signals IN A, IN B are received by a pair of respective ADCs 20A, 20B and converted to streams of digital samples, which are reduced in rate by a pair of respective decimators 21A, 21B, the outputs of which are delivered to a digital signal processor (DSP) core 16 over a pulse code modulation (PCM) bus 14. PCM bus 14 also delivers output samples from DSP core 16 to a pair of digital-to-analog converters 12A, 12B, which generate output signals OUT A, OUT B. DSP 16 is coupled to a memory 17 that stores program instructions and data, including audio data. Thus, when properly programmed, integrated circuit 10 provides an example of a generalized two-channel digital audio processing system with analog inputs and outputs. Two common reference voltages Vref_fp and Vref_rp are supplied to each of ADCs 20A, 20B and to DACs 12A, 12B. Reference voltage Vref_rp provides a voltage reference that is used during a rough charge transfer phase in ADCs 20A, 20B and DACs 12A, 12B and is generally provided from the output of a voltage reference buffer amplifier, including the consequent noise present at the amplifier output. Reference voltage Vref_fp is provided from an external filter capacitor $C_{FILT}$ that is not connected to the output of voltage reference 18, and is used in a fine charge transfer phase subsequent to the rough charge transfer phase, which eliminates the noise that would be generated across filter capacitor $C_{FILT}$ by such a connection. A complementary pair of rough charge transfer and fine charge transfer phase voltage references Vref_rn and Vref_fn, respectively, are provided from ground in the depicted embodiment, but could alternatively be provided from symmetric voltage references and filter capacitors, or a differential voltage reference buffer having outputs connected to the terminals of a single filter capacitor. Instead of a connection to the output of voltage reference 18, filter capacitor $C_{FILT}$ is charged to reference voltage Vref_fp by intermittent connection of charge transfer circuits within ADCs 20A, 20B and DACs 12A, 12B, as will be described in further detail below. A power management block 19 enables and disables the various ADCs 20A, 20B and DACs 12A, 12B according to commands received from DSP core 16. A voltage droop compensation circuit 15 receives either information from power management block 19, reference voltages Vref_fp and Vref_rp, or all of the above and compensates for the voltage droop on reference voltage Vref_fp according to one or more of the techniques described in further detail below with reference to the various embodiments of the disclosure.

Figure 2:
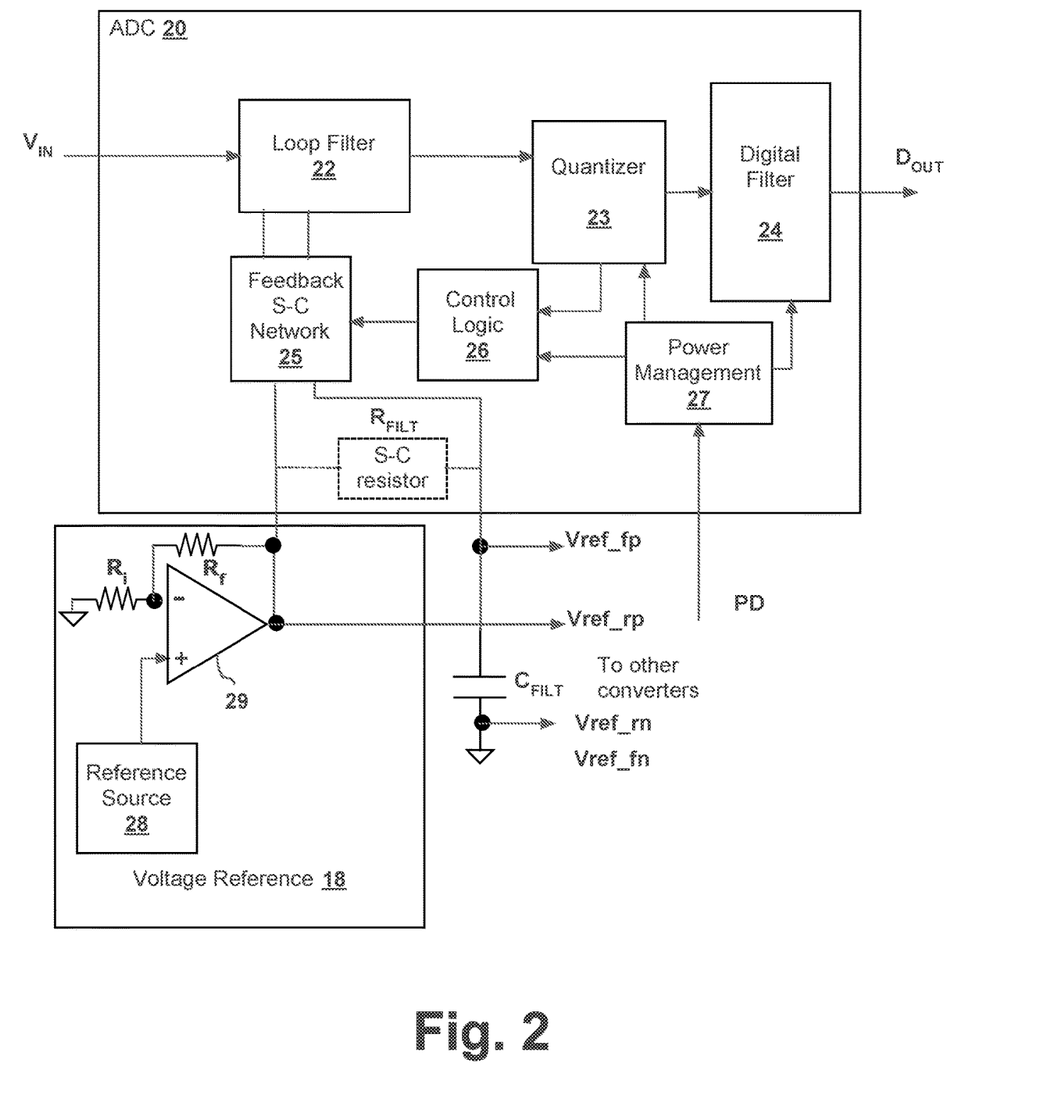
FIG. 2 is a block diagram of an example analog-to-digital converter (ADC) 20 connected to an example voltage reference circuit 18, in accordance with an embodiment of the disclosure, as may be employed in integrated circuit 10 of FIG. 1.

Referring now to FIG. 2, an example ADC 20 that may be used to implement ADCs 20A and 20B of FIG. 1, is shown, in accordance with an embodiment of the disclosure. While the principles illustrated herein are illustrated with respect to the example of a delta-sigma ADC circuit, the voltage droop due to leakage from the fine reference voltage applies equally to delta-sigma DAC circuits and is compensated for using the same techniques as disclosed herein. An input voltage $V_{IN}$ is received by an analog loop filter 22 that integrates input voltage $V_{IN}$ to generate an output supplied to an input of a quantizer 23 that generates a digital input that is filtered by a digital filter 24 to generate an output $D_{OUT}$ of ADC 20. A power management block 27, responsive to an external power down control signal PD, places ADC 20 in a power-down state and restores ADC 20 to operation on de-assertion of power down control signal PD. A feedback capacitor network 25 is selectively operated by an output of quantizer 23 to apply a reference voltage to loop filter 22 to complete the delta-sigma converter loop. A control logic 26 generates the clock phase signals that control operation of feedback capacitor network 25, and may include dynamic element matching (DEM) rotation of feedback capacitors forming feedback capacitor network 25 to reduce variation due to differences in capacitance of the capacitors within feedback capacitor network 25 having an effect on linearity due to an otherwise fixed relationship between the individual capacitors and the output codes of quantizer 23. However, DEM is not a requirement of the circuits disclosed herein, and the techniques of the present disclosure also apply to non-DEM implementations.

Voltage reference 18 supplies reference voltage VREF_R to feedback capacitor network 25 during rough charge transfer clock phases, and filter capacitor $C_{FILT}$ supplies reference voltage Vref_fp to reference feedback capacitor network 25 during fine charge transfer clock phases. Voltage reference 18 includes a voltage reference buffer amplifier 29 which receives input from a reference source 28, such as a bandgap or Zener source, and scales the voltage of reference source 28 to the required value of Vref_rp by a gain set by feedback resistor $R_f$ and input resistor $R_i$. Voltage reference circuit 18, while not directly connected to filter capacitor $C_{FILT}$, charges filter capacitor $C_{FILT}$ indirectly by the intermittent switching of capacitors in feedback capacitor network 25 between the output of voltage reference 18 during the rough charge transfer phases and to filter capacitor $C_{FILT}$ during the fine charge transfer phases, as will be described in further detail below. The switching of feedback capacitor network 25 therefore acts as a switched-capacitor resistor $R_{FILT}$, which is illustrated in FIG. 2 as a resistor, but is provided by the switching action of the feedback capacitor network 25. This switched-capacitor resistor $R_{FILT}$ forms an RC low-pass filter with filter capacitor $C_{FILT}$, which removes high-frequency noise, while disconnection of filter capacitor $C_{FILT}$ from any reference circuitry during the fine mode charge transfer phase prevents the noise present on the output of voltage reference buffer 29 from appearing in the measurement of input signal $V_{IN}$. While voltage reference filter capacitor $C_{FILT}$ is exemplified by an external capacitor as described and illustrated herein, external connection is not a limitation of the present disclosure, and the embodiments of the present disclosure should be considered as applying to voltage references with internally-formed filter capacitors.

Figure 3:
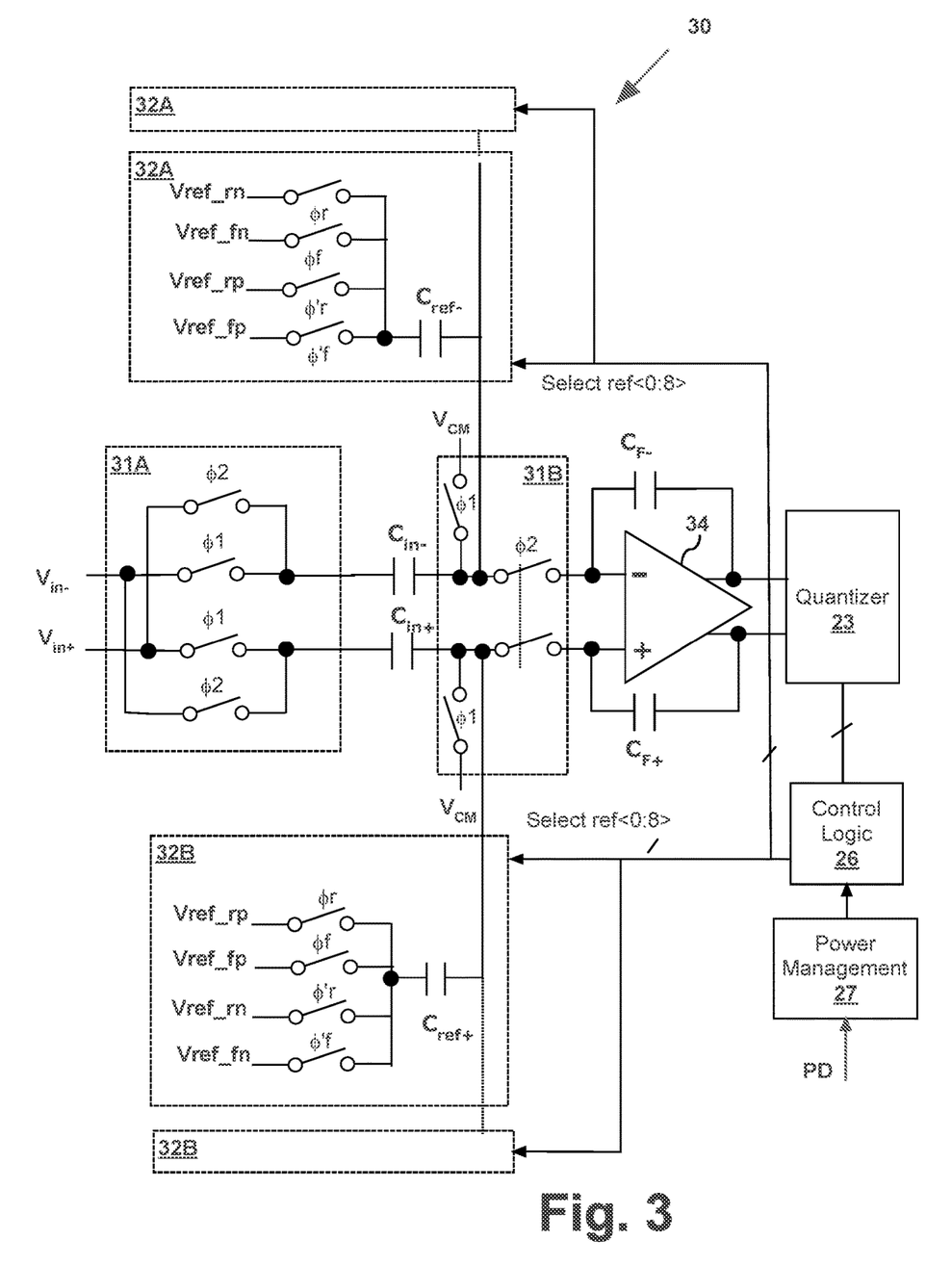
FIG. 3 is a schematic diagram showing an example delta-sigma loop circuit 30, in accordance with an embodiment of the disclosure, as may be employed in ADC 20 of FIG. 2.
Figure 5:
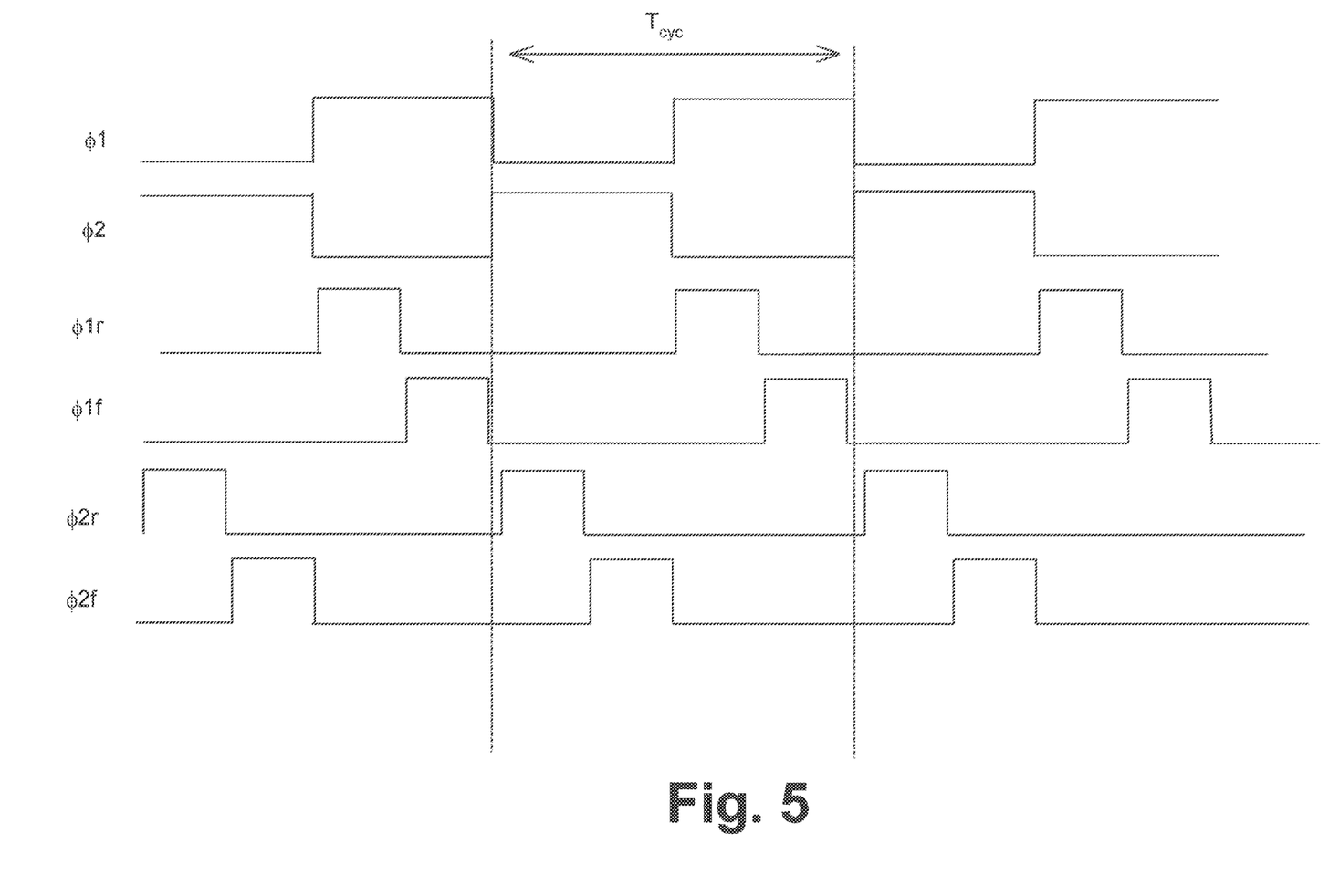
FIG. 5 is a timing diagram depicting example operation of delta-sigma loop circuit 30 of FIG. 3, in accordance with an embodiment of the disclosure.

Referring now to FIG. 3, details of an example delta-sigma loop circuit 30 that may be used to implement portions of ADC 20, are shown, in accordance with an embodiment of the disclosure. An integrator is provided by an operational amplifier 34 having feedback capacitors $C_{F-}$, $C_{F+}$ in a full differential configuration and input resistances provided by a switched capacitor network that includes an input switching network 31A, capacitors $C_{in-}$, $C_{in+}$ and a summing node switching network 31B. Differential input signal pair $V_{in-}$, $V_{in+}$ are sampled in opposite polarities during alternate clock phases φ1 and φ2 as further illustrated in the timing diagram of FIG. 5. As shown in FIG. 5, clock phases φ1 and φ2 make up a full sampling cycle of delta-sigma loop circuit 30 and correspond to one output of quantizer 23. Clock phases φ1 and φ2 each correspond to a separate reference feedback application cycle, each of which include a rough charge transfer phase φ1r, φ2r, in which reference capacitors $C_{ref-}$, $C_{ref+}$ in reference feedback switched-capacitor networks 32A, 32B, transfer charge from voltage reference 18 output that provides positive rough phase reference voltage Vref_rp or the opposite polarity rough phase reference $V_{ref\_rn}$, which in the instant embodiment is taken from ground. Each of clock phases φ1 and φ2 also include a fine charge transfer phase φ1f, φ2f, in which the reference capacitors $C_{ref-}$, $C_{ref+}$ transfer charge from filter capacitor $C_{FILT}$, providing a more accurate reference voltage that does not include noise from the various voltage reference noise sources mentioned above. Whether the individual reference capacitors $C_{ref-}$, $C_{ref+}$ in reference feedback switched-capacitor networks 32A, 32B are charged to the positive reference voltages Vref_rp and Vref_fp or to negative reference voltages Vref_rn and Vref_fn is determined according to the code at the output of quantizer 23 and from which control logic 26 generates a selection word Select ref <0:8>. If the bit in selection word Select ref <0:8> corresponding to a given capacitor is set, the φr, φf phases correspond to φ1r, φ1f, and if the bit is reset, to φ2r, φ2f. Similarly, the alternate φ'r, φ'f phases correspond to φ2r, φ2f if the bit is set, and if the bit is reset, to φ1r, φ1f. Since the polarity of the reference voltages for the φr, φf in reference feedback capacitor network 32B are opposite the polarity of the reference voltages in reference feedback capacitor network 32A for the φr, φf phases, and similarly for the φ'r, φ'f phases, for a given quantizer code the reference charge transfer is effectively performed twice with the same polarity with respect to the integrator formed around amplifier 34, which doubles the gain and also provides a null in the response at the sampling frequency, which improves performance of the delta-sigma loop circuit 30.

Figure 4A:
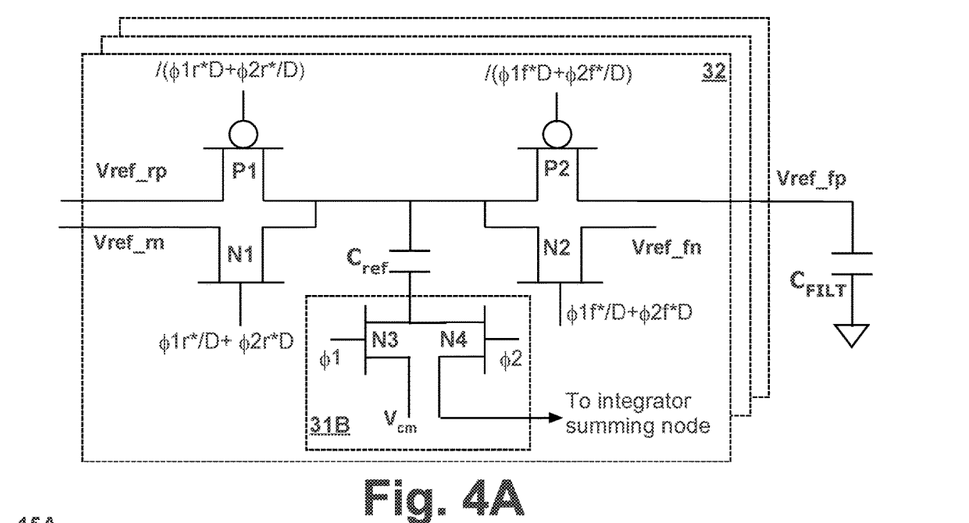
FIG. 4A is a schematic diagram depicting details of an example reference feedback switched-capacitor circuit 32 that may be used in delta-sigma loop circuit 30 of FIG. 3, in accordance with an embodiment of the disclosure.

Referring now to FIG. 4A, details of an example reference feedback switched-capacitor network 32 are shown in accordance with an embodiment of the disclosure. The illustrated circuit exemplifies a single reference capacitor $C_{ref}$, a first terminal of which is coupled to positive rough phase reference voltage Vref_rp during coarse phase φ1r through a P-type transistor P1 and to positive fine phase reference voltage Vref_fp (ground) during fine phase φ1f through another P-type transistor P2 if the corresponding quantizer output bit D is set for the illustrated individual reference capacitor $C_{ref}$. If the corresponding quantizer output bit D is instead reset (/D=TRUE), then the first terminal of reference capacitor $C_{ref}$ is alternatively coupled to negative rough phase reference voltage Vref_rn during coarse phase φ1r through an N-type transistor N1 and to negative fine phase reference voltage Vref_fp (ground) during fine phase φ1f through another N-type transistor N2. To provide differential operation across a pair of clock phases φ1, φ2, during clock phase φ2, if the corresponding quantizer output bit D is set, the first terminal of capacitor $C_{ref}$ is coupled to negative rough phase reference voltage Vref_rn during coarse phase φ2r through N-type transistor N1 and to negative fine phase reference voltage Vref_fn during fine phase φ2f through N-type transistor N2. If the corresponding quantizer output bit D is instead reset, then the first terminal of reference capacitor $C_{ref}$ is alternatively coupled to positive rough phase reference voltage Vref_rp during coarse phase φ2r through P-type transistor P1 and to positive fine phase reference voltage Vref_fp during fine phase φ1f through P-type transistor P2.

During clock phase φ1, the second terminal of reference capacitor $C_{ref}$ is coupled to common-mode voltage $V_{CM}$ by an N-type transistor N3 and during clock phase φ2, the second terminal of reference capacitor $C_{ref}$ is coupled to the summing node of the integrator (not shown) by an N-type transistor N4. If power is removed from the control logic supplying the gate control signals to N-type transistors N1-N4, leakage will be minimal, i.e. $I_{DSO}$. Power also being removed from control logic supplying the gate control signal to P-type transistor P1 does not present a problem, as any leakage from positive coarse reference voltage Vref_rp through P-type transistor P1 will not affect the voltage reference buffer. However, leakage from filter capacitor $C_{FILT}$ will occur through P-type transistor P2 in series with a parallel combination of N-type transistors N1 and N2, which are connected to negative coarse reference voltage Vref_rn (ground). The leakage causes charge to be removed from filter capacitor $C_{FILT}$, which leads to voltage droop in positive fine reference voltage Vref_fp. The voltage droop results in an ADC or DAC gain error in any ADC or DAC sharing positive fine reference voltage Vref_fp, since the input to the integrator is measured with respect to positive fine reference voltage Vref_fp.

Figure 4B:
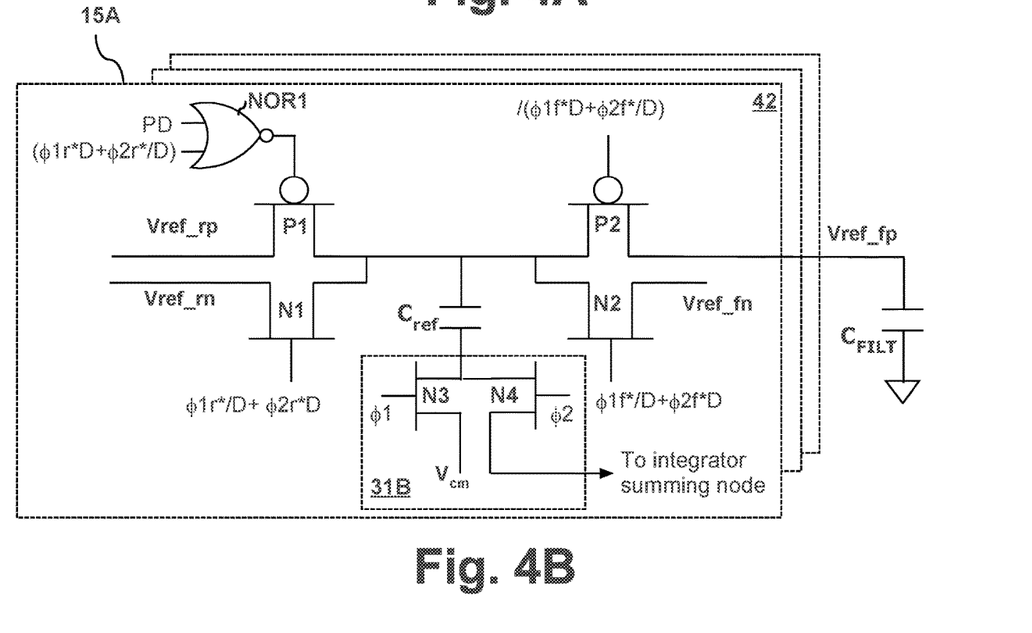
FIG. 4B is a schematic diagram depicting details of another example reference feedback switched-capacitor circuit 42 that may be used in delta-sigma loop circuit 30 of FIG. 3, in accordance with an embodiment of the disclosure.

Referring now to FIG. 4B, details of an example reference feedback switched-capacitor network 42 are shown in accordance with an embodiment of the disclosure. Reference feedback switched-capacitor network 42 is similar to reference feedback switched-capacitor network 32, so only differences between them are described below. Reference feedback switched-capacitor circuit 42 incorporates voltage droop compensation 15A in accordance with an embodiment of the disclosure. A logical-NOR gate NOR1 receives a power-down signal PD from power management block 27 of the individual converter to which reference feedback switched-capacitor circuit 42 belongs, which is replicated for each of the individual reference feedback switched-capacitor networks 32 corresponding to the individual quantizer output bits. The second input to logical-NOR gate NOR1 is the invert of the gate control signal provided to transistor P1 in reference feedback switched capacitor network 32 of FIG. 4A, i.e., the logical signal that describes when transistor P1 should be on. As long as the converter is disabled, Logical-NOR gate NOR1 will assert an output that is a logical "0" value, e.g., ground, which will hold P-type transistor P1 in an on state, causing reference capacitor $C_{ref}$ to be held at positive coarse reference voltage Vref_rp, which will reduce leakage from filter capacitor $C_{FILT}$ through P-type transistor P2, since positive fine reference voltage Vref_fp should be very close in voltage to positive coarse reference voltage Vref_rp. Thus, the operation of logical-NOR gate NOR1 provides voltage droop compensation by providing a correction current that overcomes at least most of the leakage current that would otherwise pass through P-type transistor P2 in response to power-down signal PD provided through power management control block 27 of FIG. 2.

Figure 6:
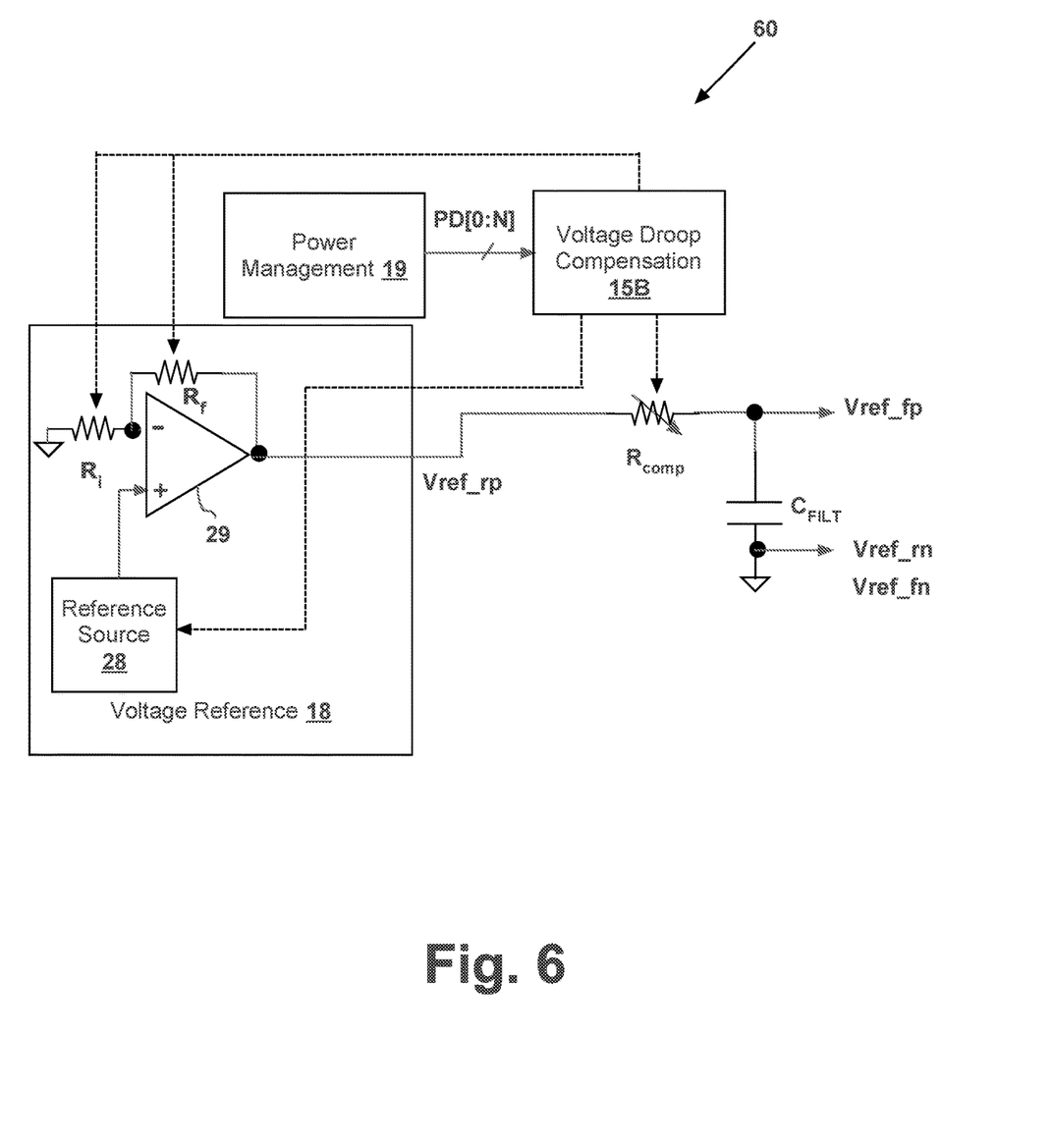
FIG. 6 is a schematic diagram showing details of example feed-forward voltage droop compensation circuits 60 that may be included in integrated circuit 10 of FIG. 1, in accordance with embodiments of the disclosure.

Referring now to FIG. 6, details of another example circuit 60 including a voltage droop compensation circuit 15B are shown in accordance with an embodiment of the disclosure. In example circuit 60, rather than modifying the reference feedback switched-capacitor network of individual ADCs or DACs, voltage droop compensation circuit 15B receives all of the power-down control signals from power management block 19 of FIG. 1. Voltage droop compensation circuit determines the quantity of ADCs and DACs that are in the inactive state according to their individual power-down signals PD[0:N] and causes a correction current to be applied to filter capacitor $C_{FILT}$ by one or more mechanisms illustrated in the Figure. A first mechanism controls the resistance of a variable (or digitally-selectable) resistor $R_{comp}$, which may be an analog or digitally-controlled variable resistance circuit that conducts current from the output of voltage reference buffer amplifier 29 to filter capacitor $C_{FILT}$ to compensate for the leakage expected from the total of the ADCs and DACs that are in the inactive state. Alternatively, or in combination, an analog and/or digital feedback control may set the values of one or both of feedback resistor $R_f$ and/or input resistor $R_i$ that control the gain of voltage reference buffer amplifier 29, or alter the voltage of voltage reference source 28 to produce a change in positive coarse reference voltage Vref_rp. Altering the positive coarse reference voltage Vref_rp slightly does not affect the gain of ADCs or DACs in active state, since ultimately it is positive fine reference voltage Vref_fp across filter capacitor $C_{FILT}$ that determines the scaling of the reference charge quanta that are applied to the integrator to cancel the input signal.

Figure 7:
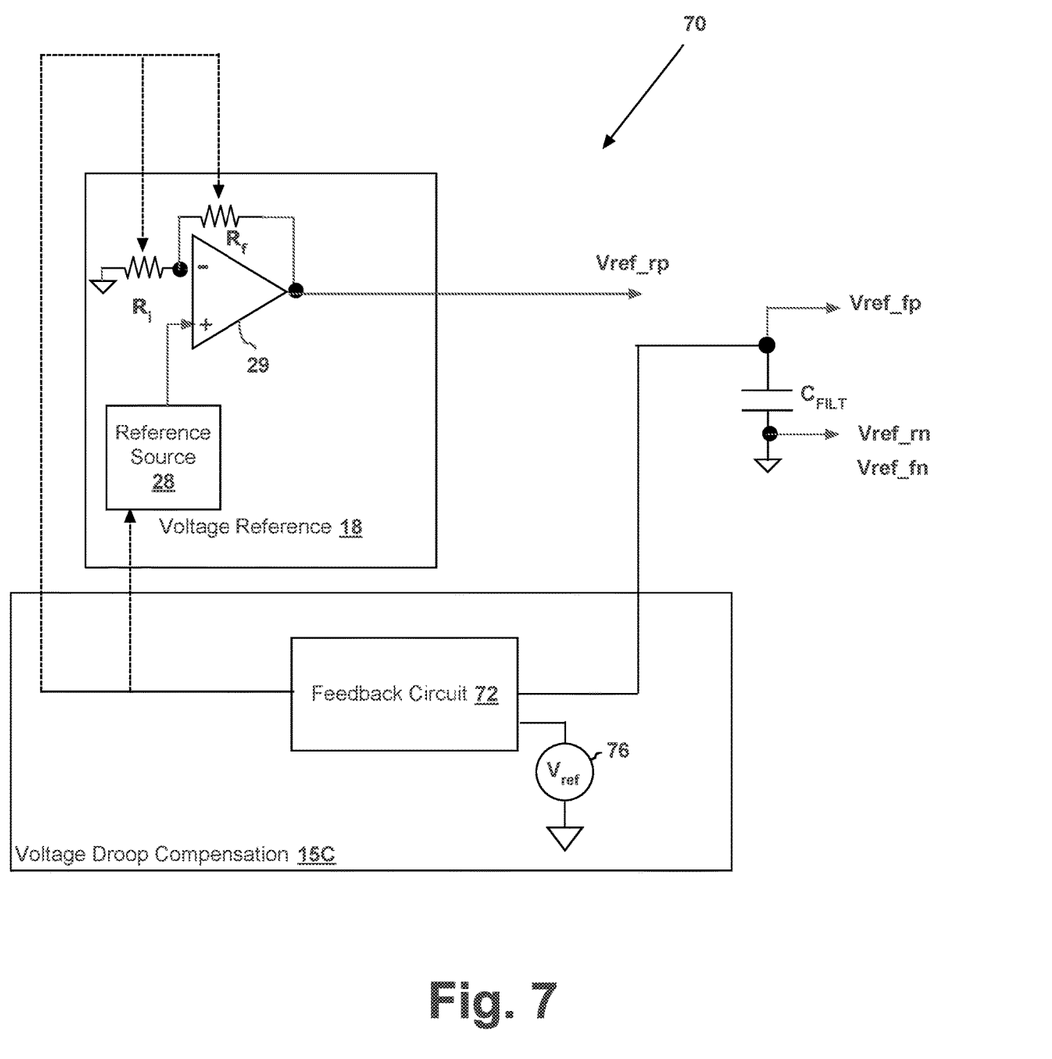
FIG. 7 is a schematic diagram showing an example general structure of other example feedback voltage droop compensation circuits 70 that may be included in integrated circuit 10 of FIG. 1, in accordance with embodiments of the disclosure.

Referring now to FIG. 7, a general structure of other example circuits 70 that include a voltage droop compensation circuit 15C are shown in accordance with embodiments of the disclosure. In example circuit 70, rather than using the power management information in a "feed-forward" manner, voltage droop compensation circuit 15C determines feedback from a difference between positive fine reference voltage Vref_fp and the desired value of positive fine reference voltage Vref_fp and may set the values of one or both of feedback resistor $R_f$ and/or input resistor $R_i$ that control the gain of voltage reference buffer amplifier 29, or alter the voltage of voltage reference source 28 to adjust positive coarse reference voltage Vref_rp, which will compensate positive fine reference voltage Vref_fp across filter capacitor $C_{FILT}$ for any voltage droop due to leakage from filter capacitor $C_{FILT}$. A separate voltage reference 76 is used to provide the desired value $V_{ref}$ of positive fine reference voltage Vref_fp, to which positive fine reference voltage Vref_fp is driven by the feedback according to an error determined by feedback circuit 72 according to the difference between positive fine reference voltage Vref_fp and desired value $V_{ref}$. Care must be taken in designing feedback circuit 72 to minimize any noise, e.g., thermal or flicker noise, power supply ripple and noise, etc., introduced by feedback circuit 72 on coarse reference voltage Vref_rp and being transferred to fine reference voltage Vref_fp via the reference switched-capacitor networks, thereby affecting the performance of the data converters.

Figure 8A:
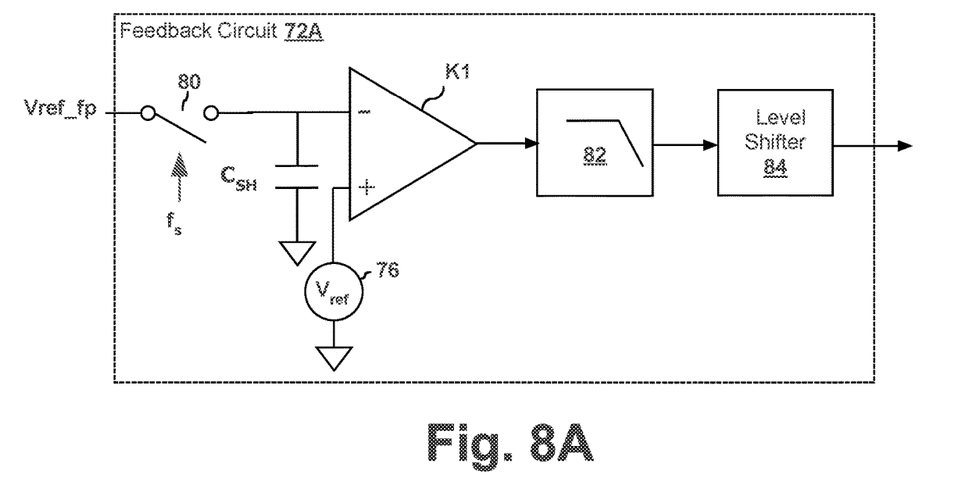
FIG. 8A is a block diagram showing details of an example feedback circuit 72A that may be used to implement feedback circuit 72 in voltage droop compensation circuit 15C of FIG. 7, in accordance with an embodiment of the disclosure.

Referring now to FIG. 8A, details of an example feedback circuit 72A that may be used to implement feedback circuit 72 of voltage droop compensation circuit 15C in example circuit 70 of FIG. 7 are shown in accordance with an embodiment of the disclosure. In feedback circuit 72A, a comparator K1 compares a sampled value of positive fine reference voltage Vref_fp to desired value $V_{ref}$ of positive fine reference voltage Vref_fp provided by voltage reference 76. Comparator K1 may alternatively be a multi-bit quantizer. Positive fine reference voltage Vref_fp sampled by a switch 80 on to a sample/hold capacitor $C_{SH}$, according to a sampling frequency $f_s$. A digital low-pass filter 82 having a pole much lower than the corner frequency of the sample/hold circuit removes high-frequency noise and sampling artifacts from the output of comparator K1. Digital low-pass filter 82 generates an output that is provided to a level shifter 84 that controls, via digitally-selected parameters, one or more of the feedback points identified in FIG. 7, e.g., selection from among resistor values for feedback resistor $R_f$ and/or input resistor $R_i$ and/or an input that controls the voltage of voltage reference source 28. Sampling frequency $f_s$ may be a very low sampling frequency since the change in positive fine reference voltage Vref_fp due to leakage is slow. Example voltage droop compensation circuit 15C, as with any of the feedback-based voltage droop compensation circuits disclosed herein, may be enabled only for a time period after the power management control block 19 enables or disables one or more of the converters. In such implementations, the output code from low-pass filter 82 is latched (held at a constant state) during the time that the voltage droop compensation circuits are disabled.

Figure 8B:
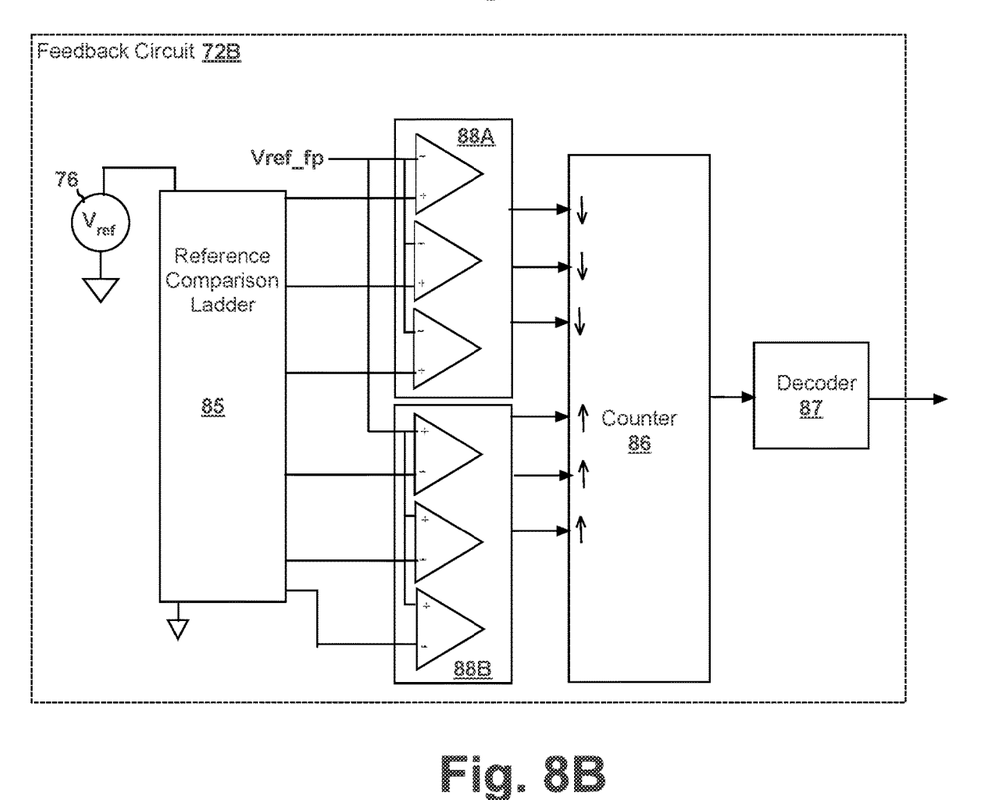
FIG. 8B is a block diagram showing details of an example feedback circuit 72B that may be used to implement feedback circuit 72 in voltage droop compensation circuit 15C of FIG. 7, in accordance with an embodiment of the disclosure.

Referring now to FIG. 8B, details of another example feedback circuit 72B that may be used to implement feedback circuit 72 of voltage droop compensation circuit 15C in example circuit 70 of FIG. 7 are shown in accordance with an embodiment of the disclosure. In feedback circuit 72B, a set of dead-band comparators 88A, 88B compare positive fine reference voltage Vref_fp across filter capacitor $C_{FILT}$ with a set of reference values derived by a reference comparison ladder circuit 85, e.g., a string of resistors, from desired value $V_{ref}$ of positive fine reference voltage Vref_fp provided by voltage reference 76. A counter accumulates the net output of dead-band comparators 88A, 88B by counting down when positive fine reference voltage Vref_fp is less than the thresholds of any of the individual comparators in comparator 88A, and counting up when positive fine reference voltage Vref_rf is greater than the thresholds of the individual comparators in comparator 88B. The output of counter 86 is provided to a decoder 87 that generates an output code that controls, via digitally-selected parameters, one or more of the feedback points identified in FIG. 7, e.g., selection from among resistor values for feedback resistor $R_f$ and or input resistor $R_i$ and/or an input that controls the voltage of voltage reference source 28. Dead-band comparators 88A, 88B implement a 7-level quantizer as shown, where the outputs of reference comparison ladder circuit 85 are, for example (from bottom to top): $V_{ref}$+deadzone+ 2*level, $V_{ref}$+deadzone +level, $V_{ref}$+deadzone, $V_{ref}$-deadzone, $V_{ref}$-deadzone-level, and $V_{ref}$+deadzone+2*level, where level is the voltage step between the thresholds and deadzone is the dead-band hysteresis value and is greater than level/2 to prevent limit-cycle oscillations due to differences between the code at the outputs of comparators 88A, 88B and the resulting change in the voltage of positive fine reference voltage Vref_fp when decoder 87 changes state. Deadzone is less than the minimum change in voltage level of positive fine reference voltage Vref_fp required to meet the maximum gain error specification of the converter, so that error in positive fine reference voltage Vref_fp will always be reduced to the degree needed, which may dictate the number of levels required from reference comparison ladder and the number of individual comparators within comparators 88A, 88B. Use of the dead-band comparator scheme of feedback circuit 72B removes the need for filtering noise from the voltage reference and feedback circuit, since the feedback loop is "broken", except at the moment when an update of decoder 87 occurs. As with the other feedback implementations disclosed above, feedback circuit 72B may be allowed to operate only when a change in the power management state of one or more converters controlled by power management control block 19 occurs, as long as the output of decoder 87 is held in the constant previous state, as described above.

Figure 9:
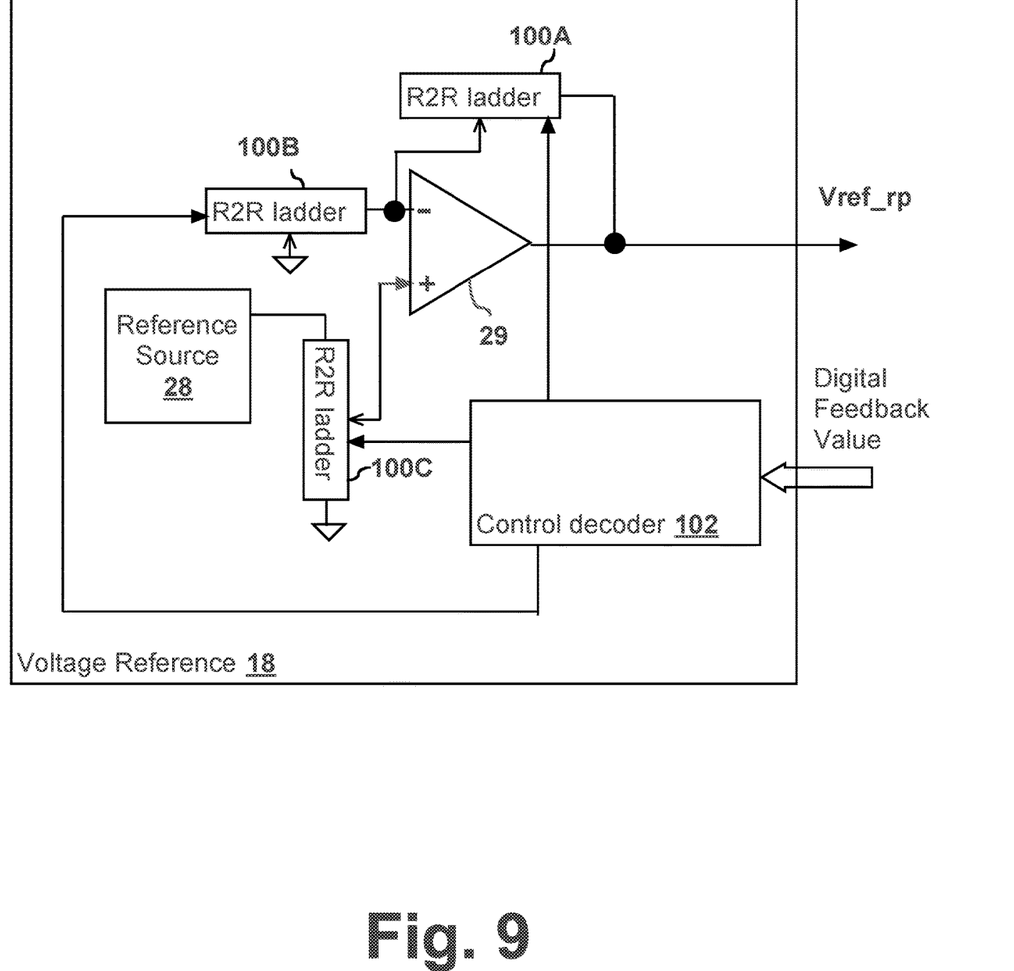
FIG. 9 is a schematic showing details of an example voltage reference circuit 18 that may be included in the embodiments of feedback voltage droop compensation circuits 70 according to FIG. 7, FIG. 8A and FIG. 8B, in accordance with embodiments of the disclosure.

Referring now to FIG. 9, an example voltage reference circuit 18 is shown as may be used in example circuits 70 of FIG. 7. Feedback resistor $R_f$ and input resistor $R_i$ of FIG. 7 have been replaced by selectable resistances exemplified by R2R ladders 100A and 100B, respectively. Another R2R ladder 100C forms a voltage divider that attenuates the output voltage of reference source 28. A control decoder 102 provides control signals to R2R ladders 100A-100C, in response to a digital feedback value provided from the output of the feedback circuit, e.g., feedback circuit 72A of FIG. 8A or feedback circuit 72B of FIG. 8B as described above. Example voltage reference circuit 18 is only an illustrative example and one or all of R2R ladders 100A-100C may be substituted with another form of selectable resistor or other type of circuit that can make adjustments to either the gain of voltage reference buffer amplifier 29 or the value of the reference voltage. Some of R2R ladders 100A-100C may be replaced with fixed resistors, as long as control decoder can properly vary coarse reference voltage Vref_rp according to the digital feedback value.

Figure 10:
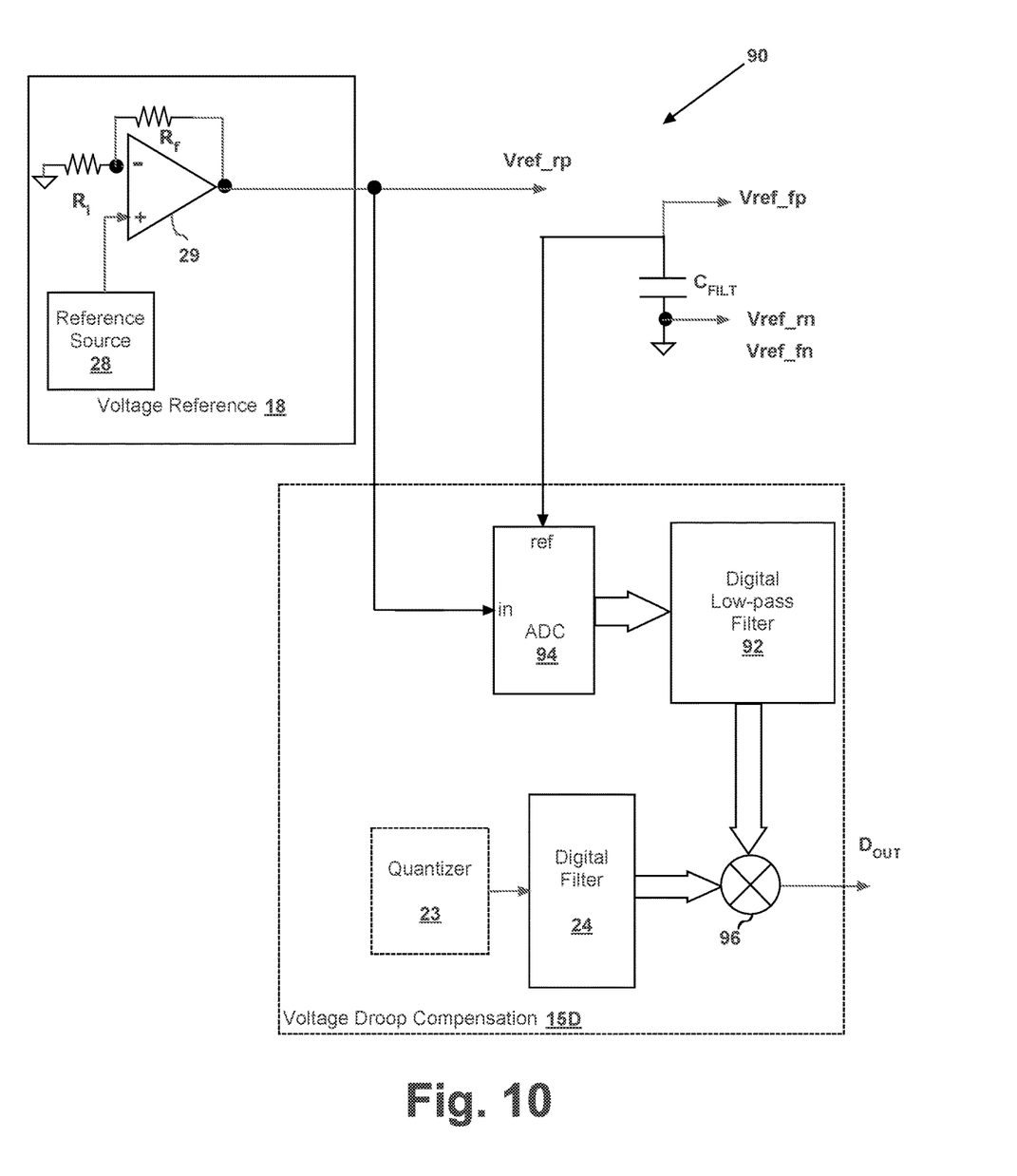
FIG. 10 is a block diagram showing details of an example feed-forward voltage droop compensation circuit 90 that may be included in integrated circuit 10 of FIG. 1, in accordance with embodiments of the disclosure.

Referring now to FIG. 10, another example circuit 90 is shown that incorporates a voltage droop compensation circuit 15D. In voltage droop compensation circuit 15D, rather than injecting a current or feedback control to compensate for voltage droop in positive fine reference voltage Vref_fp, instead, an ADC 94 compares positive fine reference voltage Vref_fp to positive rough reference voltage Vref_rp ratiometrically. A digital low-pass filter 92 filters the digital ratio provided by ADC 94 to generate a correction value that is used to correct the outputs of all of the ADCs and DACs that share filter capacitor $C_{FILT}$ and positive fine reference voltage Vref_fp. A multiplier 96 is included in each ADC/DAC that multiplies the output of digital filter 24 that filters the output of quantizer 23 in each of the converters as illustrated in FIG. 2 to correct for the gain error due to voltage droop across filter capacitor $C_{FILT}$.

In summary, this disclosure shows and describes integrated circuits having multiple switched-capacitor delta-sigma data converters and their methods of operation. The switched-capacitor delta-sigma data converter circuits may include a plurality of switched-capacitor delta-sigma data converters, the individual delta-sigma data converters may include an integrator having an input for receiving an input voltage, a quantizer for generating a digital value quantizing an output of the integrator and on average representing the input voltage, and a reference feedback switched-capacitor network alternatively coupled between a voltage reference filter capacitor and the integrator for providing feedback charge quanta representing an output of the quantizer, a power management circuit for controlling a power management state of the plurality of switched-capacitor delta-sigma data converters so that the individual switched-capacitor delta-sigma data converters are selectable between an active and an inactive state, a voltage reference circuit providing the voltage reference output, wherein the voltage reference filter capacitor is maintained at a reference voltage by periodic connection to a voltage reference buffer in coarse phases and to the reference feedback switched-capacitor networks of ones of the plurality of switched-capacitor delta-sigma data converters having the active state selected in coarse phases, and a voltage droop compensation circuit for correcting gain error in the ones of the plurality of switched-capacitor delta-sigma data converters having the active state selected due to leakage in the reference feedback switched-capacitor networks of the one or more delta-sigma data converters having the inactive state selected.

In some embodiments, the voltage droop compensation circuit may be responsive to the power management circuit for providing a correction current to one or more of the reference feedback switched-capacitor networks corresponding to one or more of the plurality of delta-sigma data converters having the inactive state selected by the power management circuit. The voltage droop compensation circuit may statically enable a switch of the one or more reference switched-capacitor networks that connects the reference voltage buffer to capacitors of the one or more reference switched-capacitor networks corresponding to the one or more delta-sigma data converters having the inactive state selected by the power management circuit. The switch may be a coarse phase charge transfer switch that periodically connects the reference voltage buffer to the capacitors of the one or more reference switched-capacitor networks during operation of the corresponding one or more delta-sigma data converters to perform conversion when the one or more delta-sigma data converters are set to the active state. The voltage droop compensation circuit may alternatively comprise a resistor that is selectably coupled between an output of the reference voltage buffer and the reference filter capacitor while the one or more delta-sigma data converters have the inactive state selected by the power management circuit. The resistor may have a selectable resistance selected in conformity with an inverse of a quantity of the one or more delta-sigma data converters that are selected as inactive, so that the resistor compensates for the voltage droop.

In some embodiments, the voltage droop compensation circuit may correct the gain of at least one of the plurality of switched-capacitor delta-sigma data converters to correct for gain error due to leakage in the reference feedback switched-capacitor networks of one or more of the plurality of switched-capacitor delta-sigma data converters that have an inactive state selected causing voltage droop across the voltage reference filter capacitor. The voltage droop compensation circuit may determine an error between a voltage across the reference filter capacitor and the reference voltage, determine a correction in conformity with the determined error, and correct the gain error of the least one of the plurality of switched-capacitor delta-sigma data converters by applying the correction. The voltage may determine the error by determining a ratio between the voltage across the filter capacitor and the reference voltage, determines a digital correction factor from the ratio, and apply the digital correction factor to conversion values provided from the at least one of the plurality of delta-sigma data converters. The voltage droop compensation circuit may comprise an analog-to-digital converter having a signal input coupled to the filter capacitor or the voltage reference buffer output and a reference input coupled to a second other one of the filter capacitor or the voltage reference buffer output, and a digital low-pass filter that generates the digital correction factor from an output of the analog-to-digital converter. The voltage droop compensation circuit may determine the error by determining a feedback from the voltage across the filter capacitor and may supply the feedback to the reference voltage buffer to adjust the reference voltage in conformity with the feedback. The voltage droop compensation circuit may determine the feedback by determining a difference between the reference voltage and the voltage across the filter capacitor, and may adjust one or more parameters of the reference voltage buffer to adjust the reference voltage to compensate for the voltage droop. The voltage droop compensation circuit may determine the feedback by applying a gain or attenuation to the voltage across the filter capacitor and supplies a feedback signal to an inverting input of the voltage reference buffer. The voltage droop compensation circuit may comprise a comparator that compares the voltage across the filter capacitor to the reference voltage, and a discrete-time low-pass filter that filters an output of the comparator to generate the feedback. The voltage droop compensation circuit may comprise a multi-level quantizer that compares the voltage across the filter capacitor to multiple voltage thresholds derived from the reference voltage with hysteresis applied to the comparisons, an accumulator for accumulating an output of the multi-level quantizer, and a decoder that generates the feedback from an output of the accumulator. The voltage droop compensation circuit may be responsive to the power management circuit and estimate the error from a quantity of the one or more delta-sigma data converters that have an inactive state selected, and supply feedback to the voltage reference buffer to correct for the gain error. The voltage droop compensation circuit may determine and apply an adjustment to the reference voltage buffer in conformity with a quantity of the one or more delta-sigma data converters that have the inactive state selected. The voltage droop compensation circuit may adjust a voltage of a voltage reference source that provides an input to the reference voltage buffer. The adjustment may adjust one or more parameters of the voltage reference buffer.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in an IC having a switched-capacitor delta-sigma data converter with an internal filter capacitor.

What is claimed is:

1. A method of reducing gain error in multiple switched-capacitor delta-sigma data converters due to leakage-based voltage droop across corresponding reference switched-capacitor networks that are maintained at a reference voltage by periodic connection to a reference voltage buffer in coarse phases and maintain a reference filter capacitor at the reference voltage by periodic connection to a filter capacitor in fine phases, the method comprising:
    receiving an indication that one or more of the multiple delta-sigma data converters are being disabled; and
    responsive to the indication that the one or more multiple delta-sigma data converters are being disabled, enabling a circuit that provides a correction current to one or more of the reference switched-capacitor networks corresponding to the one or more delta-sigma data converters that are being disabled.

2. The method of claim 1, wherein the enabling a circuit that provides a correction current to the one or more reference switched-capacitor networks comprises statically enabling a switch of the one or more reference switched-capacitor networks that connects the reference voltage buffer to capacitors of the one or more reference switched-capacitor networks corresponding to the one or more delta-sigma data converters that are being disabled while the one or more delta-sigma data converters are disabled.

3. The method of claim 1, wherein the switch of the of the one or more reference switched-capacitor networks that connects the reference voltage buffer to capacitors of the one or more reference switched-capacitor networks is a coarse phase charge transfer switch that periodically connects the reference voltage buffer to the capacitors of the one or more reference switched-capacitor networks during operation of the corresponding one or more delta-sigma data converters to perform conversion.

4. The method of claim 1, wherein the enabling a circuit that provides a correction current to the one or more reference switched-capacitor networks comprises selectably coupling a resistor between an output of the reference voltage buffer and the reference filter capacitor while the one or more delta-sigma data converters are disabled.

5. The method of claim 1, wherein the resistor has a selectable resistance, and wherein the method further comprises selecting a resistance of the resistor in conformity with an inverse of a quantity of the one or more delta-sigma data converters that are being disabled, so that the resistor compensates for the leakage-based voltage droop due to multiple disabled ones of the multiple delta-sigma data converters.

6. A method of reducing gain error in multiple switched-capacitor delta-sigma data converters due to leakage-based voltage droop across corresponding reference switched-capacitor networks that are maintained at a reference voltage by periodic connection to a reference voltage buffer in coarse phases and maintain a reference filter capacitor at the reference voltage by periodic connection to a filter capacitor in fine phases, the method comprising:
   determining an error between a voltage across the reference filter capacitor and the reference voltage caused by leakage in the reference feedback switched-capacitor networks of one or more of the multiple delta-sigma data converters that have an inactive state selected;
   determining a correction in conformity with the determined error; and
   correcting the gain error of at least one of the multiple delta-sigma data converters by applying the correction.

7. The method of claim 6, wherein the determining an error comprises determining a ratio between the voltage across the filter capacitor and the reference voltage, wherein the determining a correction determines a digital correction factor from the ratio, and wherein the correcting the gain error applies the digital correction factor to conversion values provided from the at least one of the multiple delta-sigma data converters.

8. The method of claim 6, wherein the determining a ratio is performed by supplying a first one of the voltage across the filter capacitor or the reference voltage to a reference input of an analog to digital converter and a second other one of the voltage across the filter capacitor or the reference voltage to a signal input of the analog-to-digital converter.

9. The method of claim 6, wherein the determining the correction is performed by determining a feedback from the voltage across the filter capacitor, and wherein the correcting the gain error comprises supplying the feedback to the reference voltage buffer to adjust the reference voltage in conformity with the feedback.

10. The method of claim 9, wherein the determining a feedback determines a difference between the reference voltage and the voltage across the filter capacitor, and wherein the correcting the gain error is performed by adjusting one or more parameters of the reference voltage buffer to adjust the reference voltage to compensate for the leakage-based voltage droop.

11. The method of claim 9, wherein the determining a feedback applies a gain or attenuation to the voltage across the filter capacitor and supplies a feedback signal to an inverting input of the voltage reference buffer.

12. The method of claim 9, wherein the determining a feedback comprises:
   comparing the voltage across the filter capacitor to the reference voltage to generate a binary comparison signal;
   filtering the binary comparison signal with a discrete-time low-pass filter; and
   determining the feedback from a result of the filtering.

13. The method of claim 9, wherein the determining a feedback comprises:
   quantizing the voltage across the filter capacitor with a multi-level quantizer that compares the voltage across the filter capacitor to multiple voltage thresholds derived from the reference voltage with hysteresis applied to the comparisons;
   accumulating a result of the quantizing to filter the result of the quantizing; and
   decoding a result of the accumulating to generate the feedback.

14. The method of claim 6, further comprising receiving an indication that one or more of the multiple delta-sigma data converters are being disabled, wherein the determining the error estimates the error from a quantity of the one or more multiple delta-sigma data converters are being disabled, and wherein the correcting the gain error comprises supplying feedback to the reference voltage buffer to adjust the reference voltage in conformity with the quantity of the one or more multiple delta-sigma data converters are being disabled.

15. The method of claim 14, wherein the supplying a correction comprises determining and applying an adjustment to the reference voltage buffer in conformity with the quantity of the one or more delta-sigma data converters that are being disabled.

16. The method of claim 15, wherein the adjustment adjusts a voltage of a voltage reference source that provides an input to the reference voltage buffer.

17. The method of claim 15, wherein the adjustment adjusts one or more parameters of the voltage reference buffer.

18. An integrated circuit comprising:
   a plurality of switched-capacitor delta-sigma data converters, the individual delta-sigma data converters including an integrator having an input for receiving an input voltage, a quantizer for generating a digital value quantizing an output of the integrator and on average representing the input voltage, and a reference feedback switched-capacitor network alternatively coupled between a voltage reference filter capacitor and the integrator for providing feedback charge quanta representing an output of the quantizer;
   a power management circuit for controlling a power management state of the plurality of switched-capacitor delta-sigma data converters so that the individual switched-capacitor delta-sigma data converters are selectable between an active and an inactive state;
   a voltage reference circuit providing the voltage reference output, wherein the voltage reference filter capacitor is maintained at a reference voltage by periodic connection to a voltage reference buffer in coarse phases and to the reference feedback switched-capacitor networks of ones of the plurality of switched-capacitor delta-sigma data converters having the active state selected in coarse phases; and
   a voltage droop compensation circuit responsive to the power management circuit for providing a correction current to one or more of the reference feedback switched-capacitor networks corresponding to one or more of the plurality of delta-sigma data converters having the inactive state selected by the power management circuit, whereby gain error in the ones of the plurality of switched-capacitor delta-sigma data converters having the active state selected due to leakage in the reference feedback switched-capacitor networks of the one or more delta-sigma data converters having the inactive state selected causing voltage droop across the voltage reference filter capacitor is corrected.

19. The integrated circuit of claim 18, wherein the voltage droop compensation circuit statically enables a switch of the one or more reference switched-capacitor networks that connects the reference voltage buffer to capacitors of the one or more reference switched-capacitor networks corresponding to the one or more delta-sigma data converters having the inactive state selected by the power management circuit.

20. The integrated circuit of claim 18, wherein the switch of the of the one or more reference switched-capacitor networks that connects the reference voltage buffer to capacitors of the one or more reference switched-capacitor networks is a coarse phase charge transfer switch that periodically connects the reference voltage buffer to the capacitors of the one or more reference switched-capacitor networks during operation of the corresponding one or more delta-sigma data converters to perform conversion when the one or more delta-sigma data converters are set to the active state.

21. The integrated circuit of claim 18, wherein the voltage droop compensation circuit comprises a resistor that is selectably coupled between an output of the reference voltage buffer and the reference filter capacitor while the one or more delta-sigma data converters have the inactive state selected by the power management circuit.

22. The integrated circuit of claim 18, wherein the resistor has a selectable resistance selected in conformity with an inverse of a quantity of the one or more delta-sigma data converters that are selected as inactive, so that the resistor compensates for the voltage droop.

23. An integrated circuit comprising:
 a plurality of switched-capacitor delta-sigma data converters, the individual delta-sigma data converters including an integrator having an input for receiving an input voltage, a quantizer for generating a digital value quantizing an output of the integrator and on average representing the input voltage, and a reference feedback switched-capacitor network alternatively coupled between a voltage reference filter capacitor and the integrator for providing feedback charge quanta representing an output of the quantizer;
 a voltage reference circuit providing the voltage reference output, wherein the voltage reference filter capacitor is maintained at a reference voltage by periodic connection to a voltage reference buffer in coarse phases and to the reference feedback switched-capacitor networks of ones of the plurality of switched-capacitor delta-sigma data converters having the active state selected in coarse phases; and
 a voltage droop compensation circuit for correcting the gain of at least one of the plurality of switched-capacitor delta-sigma data converters to correct for gain error due to leakage in the reference feedback switched-capacitor networks of one or more of the plurality of switched-capacitor delta-sigma data converters that have an inactive state selected causing voltage droop across the voltage reference filter capacitor, wherein the voltage droop compensation circuit determines an error between a voltage across the reference filter capacitor and the reference voltage, determines a correction in conformity with the determined error, and correct the gain error of the least one of the plurality of switched-capacitor delta-sigma data converters by applying the correction.

24. The integrated circuit of claim 23, wherein the voltage droop compensation circuit determines the error by determining a ratio between the voltage across the filter capacitor and the reference voltage, determines a digital correction factor from the ratio, and applies the digital correction factor to conversion values provided from the at least one of the plurality of delta-sigma data converters.

25. The integrated circuit of claim 24, wherein the voltage droop compensation circuit comprises:
 an analog-to-digital converter having a signal input coupled to the filter capacitor or the voltage reference buffer output and a reference input coupled to a second other one of the filter capacitor or the voltage reference buffer output; and
 a digital low-pass filter that generates the digital correction factor from an output of the analog-to-digital converter.

26. The integrated circuit of claim 23, wherein the voltage droop compensation circuit determines the error by determining a feedback from the voltage across the filter capacitor and supplies the feedback to the reference voltage buffer to adjust the reference voltage in conformity with the feedback.

27. The integrated circuit of claim 26, wherein the voltage droop compensation circuit determines the feedback by determining a difference between the reference voltage and the voltage across the filter capacitor, and adjusts one or more parameters of the reference voltage buffer to adjust the reference voltage to compensate for the voltage droop.

28. The integrated circuit of claim 26, wherein the voltage droop compensation circuit determines the feedback by applying a gain or attenuation to the voltage across the filter capacitor and supplies a feedback signal to an inverting input of the voltage reference buffer.

29. The integrated circuit of claim 26, wherein the voltage droop compensation circuit comprises:
 a comparator that compares the voltage across the filter capacitor to the reference voltage; and
 a discrete-time low-pass filter that filters an output of the comparator to generate the feedback.

30. The integrated circuit of claim 26, wherein the voltage droop compensation circuit comprises:
 a multi-level quantizer that compares the voltage across the filter capacitor to multiple voltage thresholds derived from the reference voltage with hysteresis applied to the comparisons;
 an accumulator for accumulating an output of the multi-level quantizer; and
 a decoder that generates the feedback from an output of the accumulator.

31. The integrated circuit of claim 23, further comprising a power management circuit for controlling a power management state of the plurality of switched-capacitor delta-sigma data converters so that the individual switched-capacitor delta-sigma data converters are selectable between an active and the inactive state, and wherein the voltage droop compensation circuit is responsive to the power management circuit and estimates the error from a quantity of the one or more delta-sigma data converters that have an inactive state selected and supplies feedback to the voltage reference buffer to correct for the gain error.

32. The integrated circuit of claim 31, wherein the voltage droop compensation circuit determines and applies an adjustment to the reference voltage buffer in conformity with a quantity of the one or more delta-sigma data converters that have the inactive state selected.

33. The integrated circuit of claim 32, wherein the voltage droop compensation circuit adjusts a voltage of a voltage reference source that provides an input to the reference voltage buffer.

34. The integrated circuit of claim 32, wherein the adjustment adjusts one or more parameters of the voltage reference buffer.

* * * * *